(12) United States Patent
Ohta et al.

(10) Patent No.: US 8,742,444 B2
(45) Date of Patent: Jun. 3, 2014

(54) SEMICONDUCTOR LIGHT-EMITTING DEVICE

(75) Inventors: Masataka Ohta, Osaka (JP); Takeshi Kamikawa, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 69 days.

(21) Appl. No.: 13/572,178

(22) Filed: Aug. 10, 2012

(65) Prior Publication Data

US 2013/0043499 A1 Feb. 21, 2013

(30) Foreign Application Priority Data

Aug. 19, 2011 (JP) .................................. 2011-179583

(51) Int. Cl.
*H01L 33/00* (2010.01)
*H01L 21/00* (2006.01)

(52) U.S. Cl.
USPC ............................................. 257/98; 438/30

(58) Field of Classification Search
USPC .............................. 257/13, 98–99; 438/29–32
See application file for complete search history.

(56) References Cited

U.S. PATENT DOCUMENTS

| 7,282,850 | B2 * | 10/2007 | Yoshida et al. ................ 313/486 |
| 7,559,664 | B1 * | 7/2009 | Walleman et al. .............. 362/84 |
| 8,324,797 | B2 * | 12/2012 | Shylo et al. ................... 313/503 |
| 8,384,284 | B2 * | 2/2013 | Toda et al. ..................... 313/503 |
| 2004/0095063 | A1 | 5/2004 | Murazaki et al. |
| 2007/0267645 | A1 | 11/2007 | Nakata et al. |
| 2010/0065876 | A1 | 3/2010 | Kang et al. |

FOREIGN PATENT DOCUMENTS

| JP | 2005-277299 | 10/2005 |
| JP | 2006-140532 | 6/2006 |
| JP | 2007-311707 | 11/2007 |
| JP | 2008-258617 | 10/2008 |
| JP | 2009-177098 | 8/2009 |

* cited by examiner

*Primary Examiner* — Calvin Lee
(74) *Attorney, Agent, or Firm* — Morrison & Foerster LLP

(57) ABSTRACT

A semiconductor light-emitting device (A) having a simple configuration whereby it is possible to easily and accurately confirm whether or not ultraviolet light is being emitted, the semiconductor light-emitting device comprising: a semiconductor light-emitting element (1) for emitting ultraviolet light in an ultraviolet or deep ultraviolet region; a cap part (6) having a through-hole (63) in the top part through which ultraviolet light passes and encircling the semiconductor light-emitting element (1); a translucent cover (7) for transmitting ultraviolet light, the translucent cover being disposed so as to hermetically close up the through-hole (63); and a UV-excited phosphor (8) which is excited by ultraviolet light and which emits visible light, the UV-excited phosphor being disposed inside the cap part (6).

10 Claims, 12 Drawing Sheets

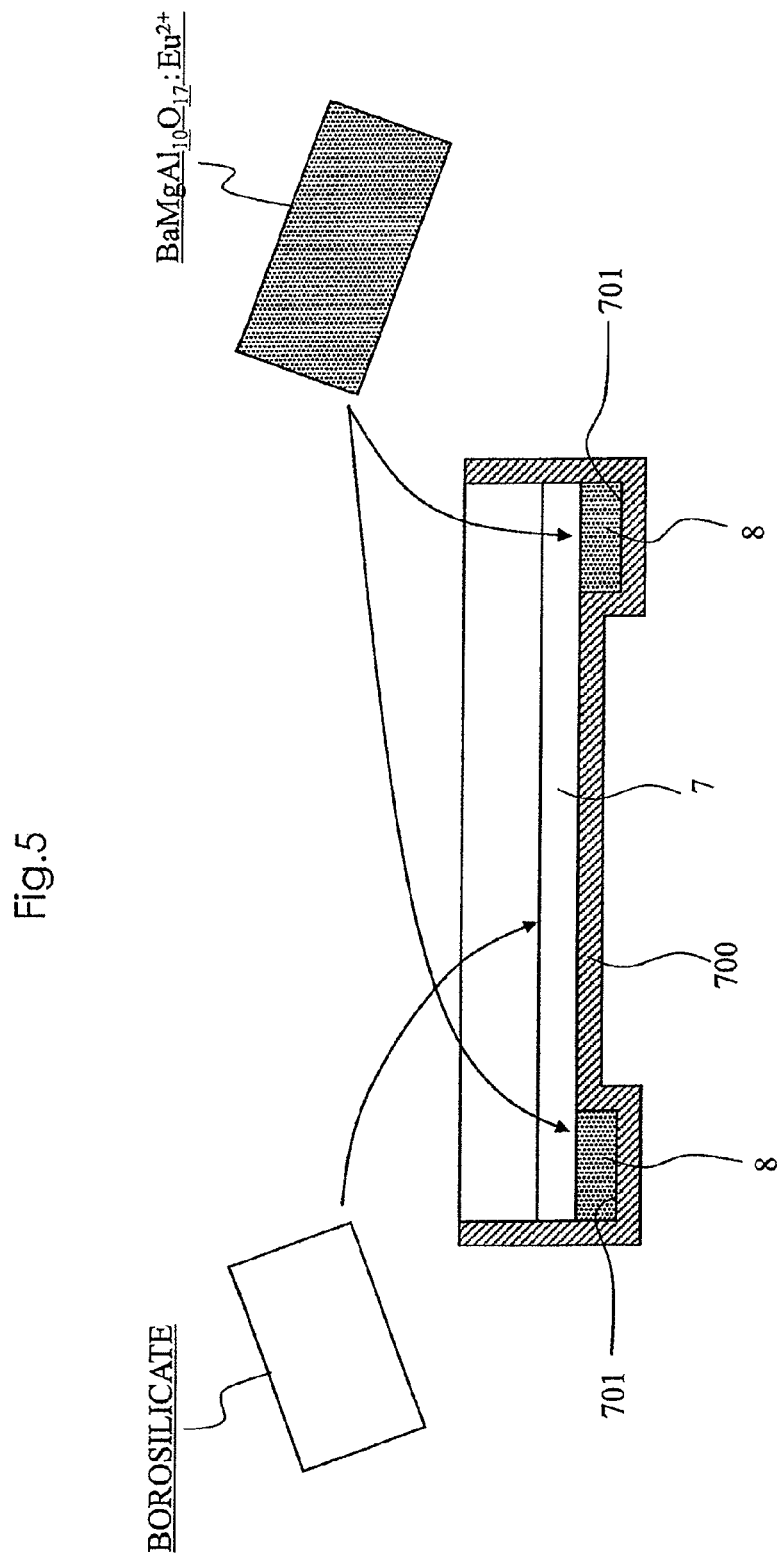

SEMICONDUCTOR LIGHT-EMITTING DEVICE

This application is based on Japanese Patent Application No. 2011-179583 filed on Aug. 19, 2011.

BACKGROUND OF THE INVENTION

1. Field of the Invention

The present invention relates to a semiconductor light-emitting device for irradiating with ultraviolet rays.

2. Description of Related Art

Nitride semiconductors, typified by GaN, AlN, InN, and mixed crystals thereof, are direct-transition semiconductor materials. Nitride semiconductors have the characteristic of having greater band gap energy than AlGaInAs-based semiconductors or AlGaInP-based semiconductors. Therefore, these nitride semiconductors are being focused on as materials constituting semiconductor laser elements for emitting light in the ultraviolet region, LED elements for emitting light in the ultraviolet region or the deep ultraviolet region (a wavelength range of approximately 320 nm to approximately 200 nm), and other semiconductor light-emitting elements.

Light in the ultraviolet region or deep ultraviolet region having a wavelength of 260 to 280 nm (may hereinafter be called ultraviolet light) is known to be efficient in disinfecting water. In addition, ultraviolet light is also known to be effective in water purification, disinfecting, high-speed decomposition treatment of pollutants, the medical field, and the like. Devices that utilize ultraviolet light can be made smaller and made to consume less power by employing semiconductor light-emitting devices that utilize semiconductor light-emitting elements for emitting light in the ultraviolet to deep ultraviolet region such as those described above.

A semiconductor light-emitting device for outputting light in the visible light region is packaged inexpensively by a mold with a resin whose light-radiating characteristics are easily controlled. However, ultraviolet light is absorbed by the resin used in the resin mold and the light cannot be extracted efficiently. The resin is deteriorated by the strong energy of ultraviolet light, causing a problem of stronger light absorption. Therefore, it is difficult to use a resin mold to package a semiconductor light-emitting device that emits light in the ultraviolet region.

Therefore, a package known as a CAN is utilized in a semiconductor light-emitting device that emits light in the ultraviolet region. FIG. 11 is a drawing of a package of a conventional semiconductor light-emitting device. The semiconductor light-emitting device D comprises an LED element 91, wires 95 for supplying electric power to the LED element 91, a reflective cup 93 fulfilling the role of a reflective plate for guiding light output from the LED element 91 upward, external pins 94 for supplying electric power, and a cap part 96 known as a CAN, as shown in FIG. 11. Furthermore, a translucent cover 97 for extracting light is adhered to the cap part 96 (see Japanese Laid-open Patent Application Nos. 2007-311707, 2008-258617, and others).

Light in the regions ultraviolet to deep ultraviolet have much energy and can adversely affect the human body in the eyes, skin, and the like. Therefore, it is necessary to recognize that ultraviolet light is being outputted by the semiconductor light-emitting device. When it is not possible to assess what range is being irradiated by the ultraviolet light (*1), problems with safety occur also when the device is actually used. The user must be able to immediately assess whether light is being emitted or not emitted, the extent of the light emission strength, and the range in which light is radiated.

Light in the regions ultraviolet to deep ultraviolet (approximately 320 nm to approximately 200 nm) cannot be perceived by the human eye, and in a semiconductor light-emitting device that emits light in the ultraviolet region, whether or not light is being emitted cannot be confirmed by the naked eye. Therefore, the light-emitting state of a semiconductor light-emitting device that emits light in the regions ultraviolet to deep ultraviolet can be confirmed utilizing a detector capable of detecting ultraviolet light, but it is troublesome to use a detector for this confirmation. When the device is utilized in common sanitary appliances or medical appliances, the common user is not likely to possess a detector and it is not easy to confirm the output of ultraviolet light.

In view of this, the ultraviolet-light-emitting device of Japanese Laid-open Patent Application No. 2009-177098 comprises an ultraviolet light LED chip from which ultraviolet light is outputted and a light-receiving element for detecting ultraviolet light. It is possible to monitor whether or not the ultraviolet light LED chip is activated by providing a visible light LED chip for monitoring activation, and causing the chip to be activated and deactivated based on the output of the light-receiving element.

However, in the ultraviolet-light-emitting device disclosed in Japanese Laid-open Patent Application No. 2009-177098, although it is possible to detect ultraviolet light without using equipment, a light-receiving element or a monitoring visible light LED chip attached to the package are needed. Because of this, the ultraviolet-light-emitting device disclosed in Japanese Laid-open Patent Application No. 2009-177098 has numerous configurationally members, and it is difficult to reduce this device in size and cost.

There are also cases in which the ultraviolet-light-emitting device is disposed inside another device, in which case it is sometimes difficult or even impossible to ascertain the starting light LED chip for monitoring, and it is sometimes difficult to accurately confirm whether or not the ultraviolet-light-emitting device has activated.

SUMMARY OF THE INVENTION

In view of this, an object of the present invention is to provide a semiconductor light-emitting device which has a simple configuration and which makes it possible to easily and accurately confirm whether or not ultraviolet light is being emitted.

To achieve the object described above, the present invention provides a semiconductor light-emitting device comprising: a semiconductor light-emitting element for emitting ultraviolet light having a wavelength in an ultraviolet or deep ultraviolet region; a cap part having in a top part a through-hole through which ultraviolet light passes, the cap part encircling the semiconductor light-emitting element; a translucent cover through which some or all of the ultraviolet light is transmitted, the translucent cover being disposed so as to hermetically close up the through-hole; and a UV-excited phosphor excited by the ultraviolet light and emitting visible light, the UV-excited phosphor being disposed inside the cap part.

According to this configuration, the UV-excited phosphor is irradiated with some of the ultraviolet light outputted from the semiconductor light-emitting element. Thereby, when the ultraviolet light is emitted from the semiconductor light-emitting element, visible light is outputted to the exterior by the UV-excited phosphor at the same time as the ultraviolet light.

By visually observing the visible light, a user or a nearby person can thereby easily recognize whether or not ultraviolet light is being outputted from the semiconductor light-emitting device. Specifically, it is possible to easily confirm whether or not ultraviolet light is being emitted with a simple configuration.

In the configuration described above, the UV-excited phosphor may be disposed on at least part of the translucent cover.

The configuration described above may further comprise a reflective cup for reflecting ultraviolet light outputted by the semiconductor light-emitting element, and the UV-excited phosphor may be disposed on at least part of the reflective cup.

In the configuration described above, the UV-excited phosphor (*3) disposed on the reflective cup may be in contact with a material for reflecting ultraviolet light in the ultraviolet or the deep ultraviolet region.

In the configuration described above, the reflective cup may be configured from a material for reflecting ultraviolet light in the ultraviolet or the deep ultraviolet region.

In the configuration described above, aluminum can be used as the material for reflecting ultraviolet light in the ultraviolet or the deep ultraviolet region.

The configuration described above may be configured so that the space encircled by the cap part and the translucent cover is airtight, and the space interior may be sealed by a dried gas.

In the configuration described above, the dried gas sealed in the interior can have a dew point of −10° C. or less.

In the configuration described above, the dried gas may be dry air or nitrogen.

According to the present invention, providing a UV-excited phosphor which is excited by ultraviolet light and which outputs visible light results in a structure in which the UV-excited phosphor is irradiated with some of the ultraviolet light outputted from the semiconductor light-emitting element; therefore, when the ultraviolet light is emitted from the semiconductor light-emitting element, visible light is outputted to the exterior by the UV-excited phosphor at the same time as the ultraviolet light. By visually confirming the visible light, a user or a nearby person can easily recognize whether or not ultraviolet light is being outputted from the semiconductor light-emitting device. When some of the ultraviolet light is absorbed by the translucent cover, the absorbed ultraviolet light can be transmitted as visible light to the outside of the translucent cover, and the light outputted from the semiconductor light-emitting element can therefore be effectively utilized.

BRIEF DESCRIPTION OF THE DRAWINGS

FIG. 5 is a drawing of a crucible used to manufacture the translucent cover and UV-excited phosphor according to the present invention;

DETAILED DESCRIPTION OF PREFERRED EMBODIMENTS

Figure 1:
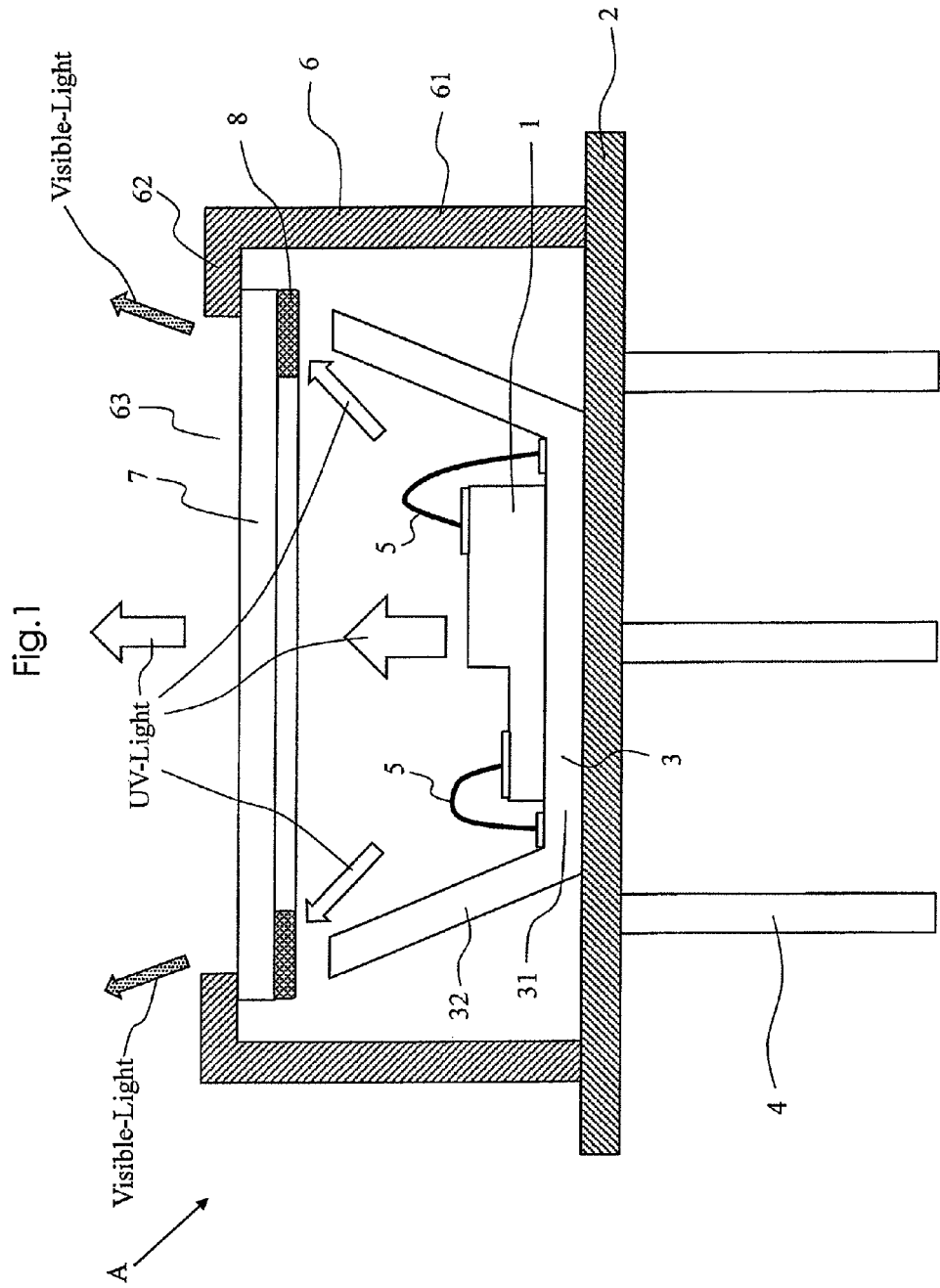
FIG. 1 is a drawing of an example of the semiconductor light-emitting device according to the present invention.

Embodiments of the present invention will be described below with reference to the drawings. FIG. 1 is a drawing of an example of the semiconductor light-emitting device according to the present invention.

First Embodiment

As shown in FIG. 1, the semiconductor light-emitting device A according to the present invention is packaged. The semiconductor light-emitting device A has a configuration in which a nitride semiconductor light-emitting element 1 (may hereinafter be called simply as an LED element 1) for outputting ultraviolet light is disposed in a metal package referred to as a CAN package.

The semiconductor light-emitting device A comprises the LED element 1, a circular plate-shaped holding base (stem) 2 for holding the LED element 1, a reflective cup 3 which is mounted on the holding base 2 and which reflects the light outputted by the LED element 1 back upward, external pins 4 which protrude from the holding base 2 and supply power to the semiconductor light-emitting device A, wires 5 for supplying the LED element 1 with the power supplied via the external pins 4, and a metal cap part 6 called a CAN which encloses the LED element 1. The semiconductor light-emitting device A also comprises a translucent cover 7 for extracting the ultraviolet light outputted by the LED element 1, the translucent cover 7 being mounted on the cap part 6, and a UV-excited phosphor 8 which is disposed in contact with part of the translucent cover 7 and is excited by ultraviolet light.

Figure 2:
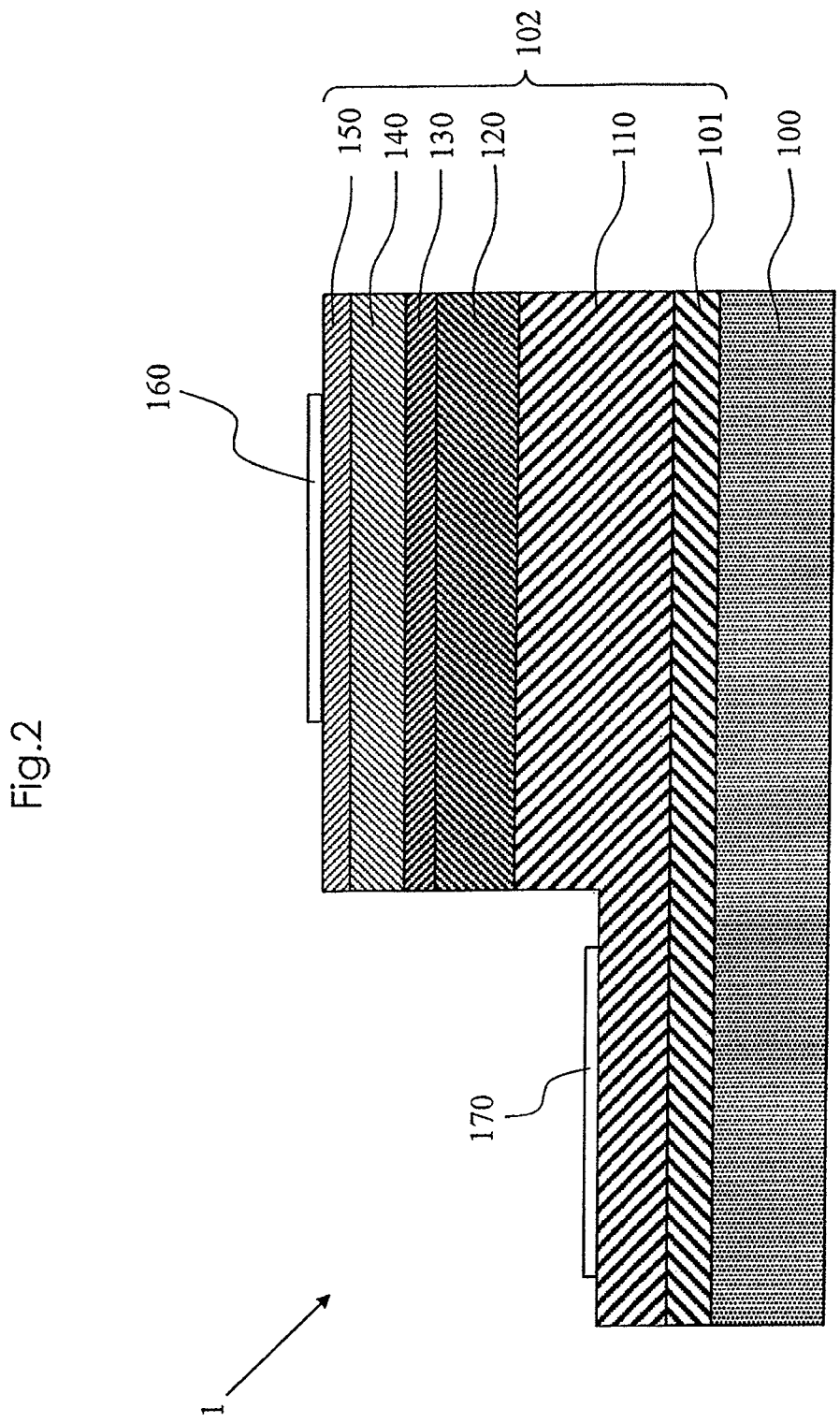
FIG. 2 is a drawing of an example of the semiconductor light-emitting element used in the semiconductor light-emitting device according to the present invention.
Figure 3:
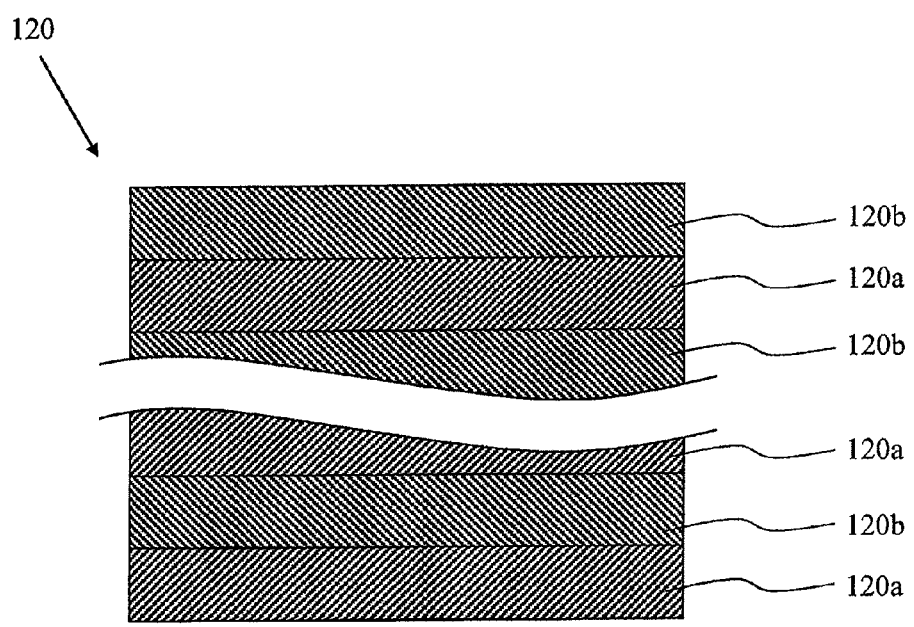
FIG. 3 is a schematic view of an active layer of the semiconductor light-emitting element shown in FIG. 2.

The nitride semiconductor light-emitting element 1 will be described in detail referring to the drawings. FIG. 2 is a drawing of an example of the nitride semiconductor light-emitting element used in the semiconductor light-emitting device according to the present invention, and FIG. 3 is a schematic view of an active layer of the nitride semiconductor light-emitting element shown in FIG. 2.

As shown in FIG. 2, the nitride semiconductor light-emitting element 1 comprises a heterogeneous substrate 100, a nitride semiconductor buffer layer 101, an n-type AlInGaN layer 110, an active layer 120, a carrier block layer 130, a p-type AlInGaN layer 140, and a p-type contact layer 150. In the following description, the nitride semiconductor buffer layer 101, the n-type AlInGaN layer 110, the active layer 120, the carrier block layer 130, the p-type AlInGaN layer 140, and the p-type contact layer 150 are sometimes referred to collectively as a nitride semiconductor layer 102.

In the semiconductor light-emitting element 1, the nitride semiconductor layer 102 is formed on the heterogeneous substrate 100 which is a sapphire substrate, an SiC substrate, an Si substrate, a graphite substrate, a spinel substrate, or the like, for example. The heterogeneous substrate 100 may be a configuration composed of a substrate composed of a nitride semiconductor.

As shown in FIG. 2, the nitride semiconductor buffer layer 101 composed of MN is formed on the top surface of the heterogeneous substrate 100. On the top surface of the nitride semiconductor buffer layer 101 is formed the n-type AlInGaN layer 110 having a thickness of approximately 1.8 to 3.5 µm. The active layer 120 is formed on the top surface of the n-type AlInGaN layer 110. On the top surface of the active layer 120 is formed the carrier block layer 130 composed of p-type AlInGaN having a thickness of approximately 15 nm, for example. The p-type AlInGaN layer 140 having a thickness of approximately 10 nm is formed on the top surface of the carrier block layer 130. The p-type contact layer 150 having a thickness of approximately 50 nm is formed on the top surface of the p-type AlInGaN layer 140. The p-type contact layer 150 may be configured from AlGaN, GaN, AlInGaN, or the like.

Next, the active layer will be described in detail. The active layer 120 has a quantum well structure in which barrier layers 120$b$ and quantum well layers 120$a$ are stacked alternately, as shown in FIG. 3. The quantum well layers 120$a$ constituting the active layer 120 are configured from semiconductor layers expressed by the compositional formula Al$\{x1\}$In$\{y1\}$Ga$\{1-x1-y1\}$N ($0<x1\leq1$, $0\leq y1\leq1$). The barrier layers 120$b$ are configured from semiconductor layers expressed by the compositional formula Al$\{x2\}$In$\{y2\}$Ga$\{1-x2-y2\}$N ($0<x2\leq1$, $0\leq y2\leq1$).

The quantum well layers 120$a$ may be configured from AlInGaN including In, or AlGaN without In. Similarly, the barrier layers 120$b$ may also be configured from AlInGaN including In, or AlGaN without In.

The Al composition ratio x1 of the quantum well layers 120$a$ is preferably in the range $0.15\leq x1\leq1.00$, and more preferably in the range $0.30\leq x1\leq1.00$. Even more preferable is the range $0.45\leq x1\leq1.00$. The quantum well layers may also contain In, and the In composition ratio y1 is preferably in the range $0.00\leq y1\leq0.12$. Having an In composition ratio in a range of 0.12 (12%) or less makes it possible to suppress the deterioration of crystal quality that results from a high In composition.

Increasing the Al composition ratio to 0.30 (30%) or more or even further to 0.45 (45%) or more causes the wavelength of light outputted from the nitride semiconductor light-emitting element 1 to be shorter. Though described hereinafter, the optical absorption spectrum of the translucent cover 7 rises suddenly at wavelengths near 250 nm (in FIG. 4 described hereinafter, the light transmittance decreases suddenly). This is more preferable because the shorter the wavelength of ultraviolet light outputted from the LED element 1, the greater the effect of conversion to visible light that is not affected by optical absorption in the UV-excited phosphor 8.

The Al composition ratio x2 of the barrier layers 120$b$ is preferably in the range $0.20\leq x2\leq1.00$. The Al composition ratio x2 of the barrier layers 120$b$ is more preferably in the range $0.35\leq x2\leq1.00$, and more preferably in the range $0.50\leq x2\leq1.00$.

By setting the composition of the barrier layers 120$b$ in the above range, a band gap can be formed that is higher than the band gap of the quantum well layers 120$a$, and the carrier is effectively confined. The In composition ratio y2 is preferably in the range $0.00\leq y2\leq0.08$. Having the In composition ratio in a range of 0.08 (8%) or less makes it possible to suppress the deterioration of crystal quality that results from a high In composition.

When the barrier layers 120$b$ contain In, they are preferably configured so that their In composition ratio y2 is less than the In composition ratio y1 of the quantum well layers 120$a$. A band gap higher than the band gap of the quantum well layers 120$a$ can be formed by making the In composition ratio y2 of the barrier layers 120$b$ lower than the In composition ratio y1 of the quantum well layers 120$a$.

The Al composition ratio and In composition ratio of the n-type AlInGaN layer 110 may be set to the same as those of the barrier layers 120$b$. The composition ratios of the n-type AlInGaN layer 110 and the barrier layers 120$b$ may be different, but they are preferably set to the same ratios as described above because there will then be no lattice mismatch difference in their interfaces. When the compositions differ, the band gap of the n-type AlInGaN layer 110 is preferably configured so as to be greater than the band gap of the barrier layers 120$b$. With such a configuration, the carrier can be effectively confined in the active layer 120. The Al composition ratio and In composition ratio of the p-type AlInGaN layer 140 may be the same as those of the barrier layers 120$b$ or they may be different, similar to the n-type AlInGaN layer 110.

As shown in FIG. 2, the LED element 1 is a light-emitting diode element having a so-called horizontal structure, and part of the nitride semiconductor layer 102 formed on the top surface of the heterogeneous substrate 100 is carved out by dry etching or the like from the p-type contact layer 150 down to a depth partway through the n-type AlInGaN layer 110. An n-side electrode 170 is formed on the bottom surface of the carved-out portion (on the n-type AlInGaN layer 110). The n-side electrode 170 can be either an Al electrode, or an Ag/Cu electrode having multi-layered structure in which an Ag layer and a Cu layer are stacked sequentially from the substrate upward. A p-side electrode 160 is also formed on the p-type contact layer 150. This p-side electrode 160 can be a Ni/Au electrode having a multi-layered structure in which an Ni layer (not shown) and an Au layer (not shown) are stacked sequentially from the p-type contact layer 150 upward. The electrode materials of the n-side electrode 170 and the p-side electrode 160 are only examples and are not limited as such. The wires 5 are connected to the n-side electrode 170 and the p-side electrode 160 as shown in FIG. 1.

In the nitride semiconductor light-emitting element 1, the nitride semiconductor layer 102 described above is formed on the top surface of the wafer of the heterogeneous substrate 100. The semiconductor layers of the nitride semiconductor layer 102 are formed by a film-forming method such as metal organic chemical vapor deposition (MOCVD) or another epitaxial growth method. With a method such as dry etching, the semiconductor layers are carved out from the p-type contact layer 150 down to a depth partway through the n-type AlInGaN layer 110. The p-side electrode 160 is formed on the top surface of the p-type contact layer 150 and the n-side electrode 170 is formed on the top surface of the n-type AlInGaN layer 110. The p-side electrode 160 and the n-side electrode 170 are also formed by electron beams, resistance heating, sputtering, or another film-forming method. At this time, a plurality of nitride semiconductor light-emitting elements 1 are formed side by side on the top surface of the wafer.

Using a laser scribing equipment on the wafer, dividing grooves are formed in the border portions of the nitride semiconductor light-emitting elements 1, and the elements are divided (cleft) with a braking equipment and formed into chip shapes. The wavelength of light emitted by the nitride semiconductor light-emitting elements 1 configured as described above is approximately 280 nm. The nitride semiconductor light-emitting elements 1 formed into chip shapes are installed on the CAN package and the semiconductor light-emitting device A is formed.

The holding base 2 is a metal circular plate-shaped member, the reflective cup 3 is mounted on one surface of the holding base 2, and the external pins 4 protrude from the surface on the opposite side. The holding base 2 is formed so as to have a certain volume and surface area, and the holding base 2 thereby acts as a heat-radiating plate for externally releasing the heat produced by the driving of the LED element 1.

The reflective cup 3 has a bottomed box shape in the shape of a cone, and comprises a circular bottom part 31 and a side wall part 32 spreading out from the edge of the circular bottom part 31. The LED element 1 is fixed in the middle of the circular bottom part 31. The inside surface of the side wall part 32 of the reflective cup 3 is formed into a mirror surface that can efficiently reflect ultraviolet light outputted by the LED element 1. The shape of the reflective cup 3 is not limited to a bottomed box shape in the shape of a cone, and need only be a configuration that guides light upward in the drawing.

The external pins 4 are electrodes for supplying power for driving the LED element 1 from a power source disposed outside of the semiconductor light-emitting device A. In the semiconductor light-emitting device A shown in FIG. 1, there are three external pins 4 in the described examples, but the pins are not limited to this example, and many configurations capable of safely supplying power can be employed.

The external pins 4 are electrically connected with the wires 5. There are two wires 5 provided to the LED element 1 as shown in FIG. 1, one wire being connected to the p-side electrode 160 and the other wire being connected to the n-side electrode 170. The power supplied from the external pins 4 is supplied to the LED element 1 via the wires 5.

The cap part 6 is a metal cylindrical member and is disposed on the holding base 2 so as to cover the LED element 1. The cap part 6 comprises a curved surface part 61, a flat plate part 62 covering the end of the curved surface part 61 opposite of the side fixed to the holding base 2, and a circular through-hole 63 formed in the middle of the flat plate part 62. The cap part 6 is fixed to the holding base 2 by welding or another conventionally well-known method, for example.

Because the cap part 6 is made of metal, light outputted by the LED element 1 is blocked. Therefore, the light outputted by the LED element 1 is outputted to the exterior only from the through-hole 63. The shape of the side wall part 32 of the reflective cup 3 is established so that the light outputted by the LED element 1 is efficiently directed to the through-hole 63.

As shown in FIG. 1, the semiconductor light-emitting device A is mounted to the inner sides of the flat plate part 62 of the cap part 6 so as to cover the through-hole 63, and is at least provided with the circular plate-shaped translucent cover 7 which transmits light of a predetermined wavelength range with a certain transmittance or greater. In the semiconductor light-emitting device A, the LED element 1 is covered by the cap part 6 to which the translucent cover 7 is mounted, whereby the LED element 1 is sealed off.

The translucent cover 7 will be described in further detail. As the material of the translucent cover of the light-emitting device comprising the LED element 1, common glass used often in conventional practice has the characteristic of absorbing ultraviolet rays. Because the LED element 1 is an element that outputs ultraviolet rays, when the translucent cover 7 is formed from common glass, the semiconductor light-emitting device A sometimes loses light-emitting efficiency. In view of this, in the semiconductor light-emitting device A, the translucent cover 7 is formed from borosilicate glass.

Figure 4:
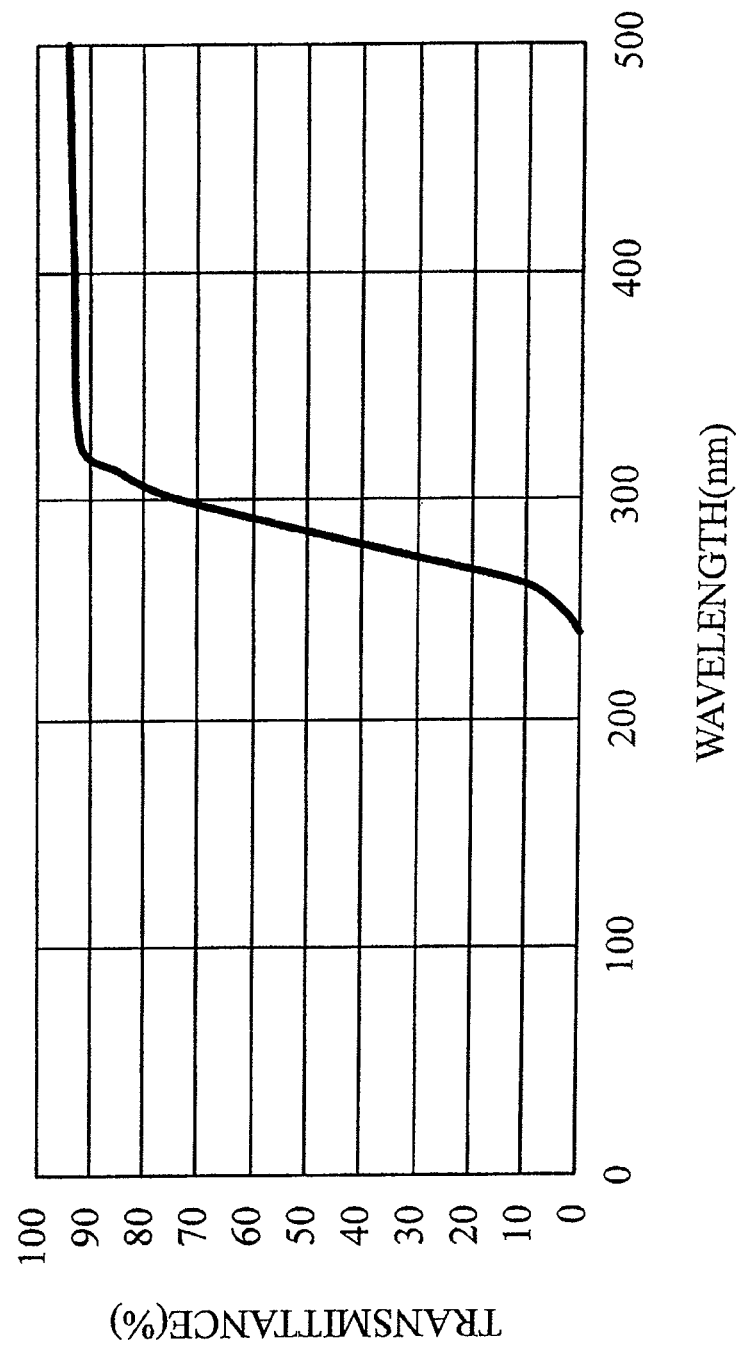
FIG. 4 is a graph of the wavelength dependence of light transmittance of borosilicate glass 1 mm in thickness.

Borosilicate glass has characteristics such as those shown in FIG. 4. FIG. 4 is a graph of the wavelength dependence of light transmittance of borosilicate glass 1 mm in thickness. As shown in FIG. 4, the light transmittance of borosilicate glass decreases at approximately 250 to 300 nm. In other words, borosilicate glass has a high absorption rate of ultraviolet light or deep ultraviolet light of a wavelength of approximately 250 to 300 nm, and a high transmittance of visible light having a longer wavelength than ultraviolet light. Specifically, using the translucent cover 7 formed from borosilicate glass can inhibit absorption of ultraviolet light or deep ultraviolet light of a wavelength of approximately 300 nm or greater, and can increase the light-emitting efficiency of the semiconductor light-emitting device A. Borosilicate glass is a substance widely used as translucent covers of CAN packages of semiconductor laser elements.

The UV-excited phosphor 8 is provided to the surface of the translucent cover 7 on the side opposite the surface in contact with the flat plate part 62. The UV-excited phosphor 8 is excited by light in the ultraviolet or deep ultraviolet region and is a phosphor that emits light in the visible light region.

In the semiconductor light-emitting device A, the middle portion of the translucent cover 7 is region where the strength of ultraviolet or deep ultraviolet light outputted from the LED element 1 is high. Therefore, when the UV-excited phosphor 8 is formed in the middle portion, a large amount of ultraviolet or deep ultraviolet light is absorbed, and there is a large loss of light output. Therefore, the UV-excited phosphor 8 is an annular member disposed in the peripheral portion of the translucent cover 7, excluding the middle portion. The UV-excited phosphor 8 excited by ultraviolet or deep ultraviolet light is formed on the inner sides of the translucent cover 7 (the inner sides of the cap part 6).

In the semiconductor light-emitting device A, light emitted by the LED element 1 and outputted to the exterior from the through-hole 63 passes through the translucent cover 7. The middle portion of the translucent cover 7 transmits ultraviolet light or deep ultraviolet light as is (partially absorbed). Because the UV-excited phosphor 8 is formed on the peripheral portion of the translucent cover 7, the visible light resulting from the UV-excited phosphor 8 being excited by ultraviolet light is transmitted in the peripheral portion of the translucent cover 7. Because of this, the light outputted by the through-hole 63 of the cap part 6 is ultraviolet light (including deep ultraviolet light) in the middle portion, and is mostly visible light in the peripheral portion. The ultraviolet light of the wavelength range absorbed in the translucent cover 7 is converted to visible light in the UV-excited phosphor 8 and transmitted through the translucent cover 7, and the light outputted by the LED element 1 can therefore be effectively utilized.

The following materials are possible examples of the material constituting the UV-excited phosphor 8.

$Ca_3(PO_4)_2Ca(F,Cl)_2Sb^{3+},Mn^{2+}$ $BaMgAl_{10}O_{17}:Eu^{2+}$ $Zn_2SiO_4:Mn^{2+}$ $LaPo_4:Tb^{3+}$ $YBO_3:Eu^{3+}$ $Y_2O_3:Eu^{3+}$

Other options which may be used include Ca-α sialon yellow phosphor, a $CaAlSiN_3$ (CASN) red phosphor, a β sialon green phosphor, and the like, in which $Eu^{2+}$ ions have been activated in the nitride or oxynitride host crystals.

Other than the materials described above, also widely used are materials that are excited by excitation light in the ultraviolet or deep ultraviolet region and that emit visible light.

The wavelength of the visible light outputted by the UV-excited phosphor 8 changes depending on the material. The UV-excited phosphor 8, which is a material capable of efficiently converting ultraviolet light to visible light, is preferably one whereby the wavelength of the light made visible becomes a nearly green wavelength highly visible to the human eye. Forming the UV-excited phosphor 8 on the inside surface of the translucent cover 7 separated from the LED element 1, as is the case in the semiconductor light-emitting device A, also has the merit of lessening the effect of the heat generated from the LED element 1.

The method for manufacturing the translucent cover 7 and the UV-excited phosphor 8 are described hereinbelow. FIG. 5 is a drawing of a crucible used to manufacture the translucent cover and the UV-excited phosphor according to the present invention. The translucent cover 7 and the UV-excited phosphor 8 are formed integrally by sintering. The translucent cover 7 is formed by sintering borosilicate with a cylindrical glass-sintering crucible 700 that has a bottom part, as shown in FIG. 5. An annular groove 701 is formed in the edge of the bottom part of the crucible 700. The material of the UV-excited phosphor 8 described above is put in the annular groove 701 and the borosilicate is put on top, after which sintering is performed, thereby integrally forming the translucent cover 7 and the UV-excited phosphor 8 (see Japanese Laid-open Patent Application No. 2008-19109, for example).

Figure 6A:
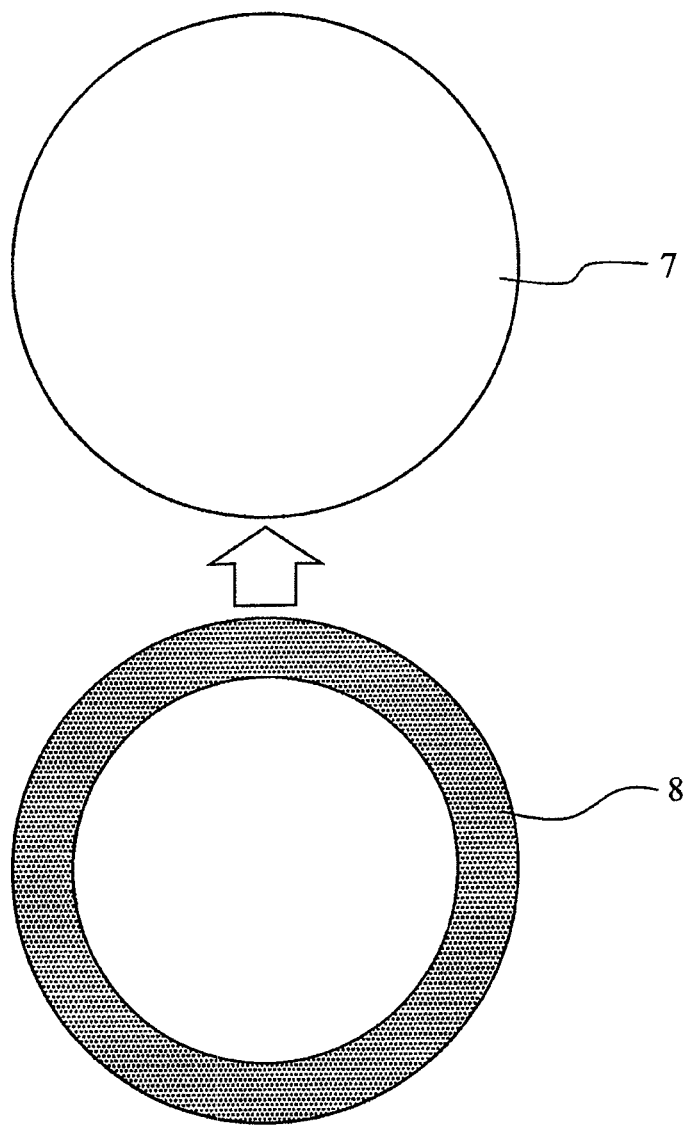
FIG. 6A is a drawing of the translucent cover and the UV-excited phosphor according to the present invention.
Figure 6B:
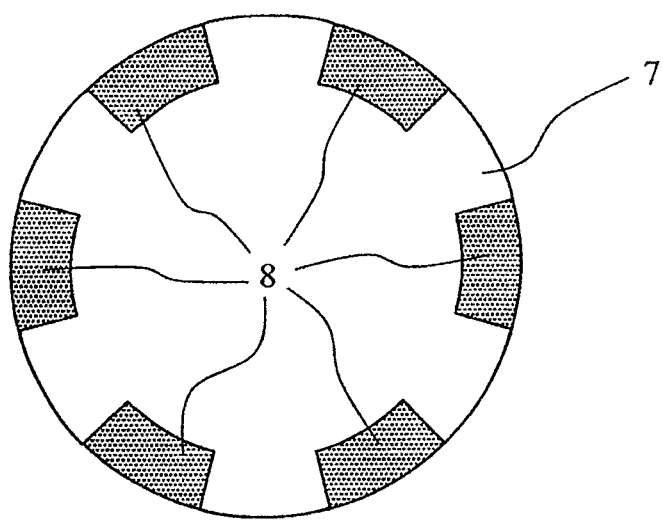
FIG. 6B is a drawing of the translucent cover and the UV-excited phosphor according to the present invention.

FIGS. 6A and 6B are drawings of other examples of the translucent cover and the UV-excited phosphor. The UV-excited phosphor 8, which is the material of the UV-excited phosphor 8 mixed with borosilicate and sintered into a ring shape, may be manufactured as being adhered to the translucent cover 7, as shown in FIG. 6. In this case, the phosphor is preferably adhered with an adhesive that has high transmittance in the visible light region. The above-described sintering method is more preferably used because there is no concern over the adhesive being absorbed, the adhesive deteriorating due to ultraviolet light, and other problems. The manufacturing method is also not limited to the method herein.

A non-continuous formation such as is shown in FIG. 6B can be formed by forming the groove 701 of the crucible 700 into a non-continuous annular shape divided partway through. It is also possible to form the UV-excited phosphor 8 in a single location on the translucent cover 7 by forming the groove 701 in a single location in the edge of the bottom part of the crucible 700. The structures of the UV-excited phosphor 8 and the translucent cover 7 is not limited to these examples, and a configuration in which the UV-excited phosphor 8 is disposed in the periphery of the translucent cover 7 can also be widely employed.

With this configuration, the UV-excited phosphor 8 is irradiated by the ultraviolet light (including light of a wavelength in the deep ultraviolet region) outputted from the LED element 1, whereby visible light is outputted. Because visible light is outputted, the user can confirm whether or not the semiconductor light-emitting device A is activated without using a detector or the like, and accidents of the eyes or skin being mistakenly irradiated by ultraviolet light can be suppressed.

Next, a specific example of the semiconductor light-emitting device A will be described. $BaMgAl_{10}O_{17}:Eu^{2+}$ was used as the material of the semiconductor light-emitting device A and the UV-excited phosphor 8. As was described above, light of a wavelength of approximately 280 nm was outputted from the LED element 1. Some of the outputted light was absorbed in the UV-excited phosphor 8, and the UV-excited phosphor 8 was excited. Visible light of approximately 450 nm was thereby emitted by the UV-excited phosphor 8.

By repeating the experiment, the inventors of the present invention have discovered that deterioration over time of the UV-excited phosphor 8 disposed inside can be greatly suppressed by enclosing dry air or nitrogen (N2) in the space encircled by the holding base 2, the cap part 6, and the translucent cover 7 and further hermetically sealing this space.

It was also found that when the space is sealed with these gases, controlling the internal dew point is vital to stabilizing the characteristics of the nitride semiconductor light-emitting element (the LED element) 1. When the dew point is high, it is anticipated that there will be much residual moisture in the sealed interior, and the nitride semiconductor light-emitting element 1 is believed to deteriorate (increase in voltage) due to hydrogen, a constituent element of water. Specifically, it is believed that the hydrogen will react with Mg, a p-dopant, and the voltage will increase. Such a phenomenon is believed to be strikingly apparent in a nitride semiconductor light-emitting element that has p-type AlGaN with a high Al composition ratio and that emits ultraviolet light.

Voltage increases were compared between initial characteristics and after driving at room temperature with a continuous waveform for 500 hours at 20 mA. The comparison was made with a sample nitride semiconductor light-emitting element 1 having the configuration shown in FIG. 2, the contact layer 150 being p-doped GaN, and the p-type AlInGaN layer 140 in contact with the contact layer 150 being p-doped Al, 0.30 Ga, and 0.70 N. As a result, a voltage increase of 0.31 V was surveyed at a dew point of 5° C., but the voltage increase was 0.25 V at a dew point of 0° C. and 0.10 V at a dew point of −10° C. From the above it was found that the effect of element deterioration lessened as the dew point temperature was lowered. This effect was greatly reduced at temperatures of −10° C. and below.

As a result of performing the same comparison with a sample whose p-type AlInGaN layer 140 was p-doped Al0.10 Ga0.90 N, the change in voltage was small at about 0.06 V despite the change in dew point. The same comparison was performed with GaN having an Al composition ratio of 0%, but there was virtually no voltage change observed. Because of this, this phenomenon is believed to be unique to a nitride semiconductor light-emitting element 1 configured from AlInGaN having a high Al composition ratio.

As an example of a case of a high Al composition, the same comparison was performed with a sample whose p-type AlInGaN layer 140 was p-doped Al0.50 Ga0.50 N. As a result, a voltage increase of 0.53 V was surveyed at a dew point of 5° C., but the voltage increase was 0.42 V at a dew point of 0° C. and 0.23 V at a dew point of −10° C. A voltage increase of 0.14 V was surveyed when the dew point was further lowered to −20° C. With a nitride semiconductor light-emitting element having a layer with an Al composition ratio of 50% or greater, a suppression of element deterioration was surveyed by further lowering the dew point temperature of the gas enclosed in the interior from −10° C. to −20° C. Higher Al compositions resulting in lower dew points are believed to be preferable.

Because of the above, the effect caused by lowering the dew point of gas enclosed in the interior was seen to be more striking in regions of high Al composition ratios, i.e., regions of Al composition ratios of 50% or greater, than in regions of low Al composition ratios (e.g., regions of Al compositions of about 10%). The dew point of gas enclosed in the interior is preferably −10° C. or less, and more preferably −20° C. or less.

Light of the deep ultraviolet region, which is largely absorbed by water, has an adverse effect on the characteristics of the semiconductor light-emitting device A. By lowering the dew point of gas enclosed in the interior, residual moisture can be reduced, the absorption of light of the deep ultraviolet region by water can be suppressed, and decreases in light-emitting efficiency of the semiconductor light-emitting device A can be suppressed.

Furthermore, light of a wavelength shorter than approximately 240 nm is absorbed by oxygen. This is because oxygen atoms absorb the light and decompose into ozone and active oxygen. The active oxygen produced has a high oxidizability and oxidizes things in the package interior, and therefore will sometimes be the cause of deterioration of the element. Since nitrogen is substantially not decomposed at light of a wavelength longer than approximately 200 nm, when a nitride semiconductor light-emitting element 1 is utilized that emits light at a shorter wavelength than wavelengths of approximately 240 nm or less that are largely absorbed by oxygen, nitrogen gas is more preferred than dry air containing oxygen as the gas enclosed in the package. In the description above, dry air and nitrogen are given as examples of the enclosed gas, but the gas is not limited to these examples, and a gas that has low ultraviolet light absorptivity and that does not chemically react (or is hard to chemically react) with the layers of the nitride semiconductor light-emitting element can also be used.

Figure 7:
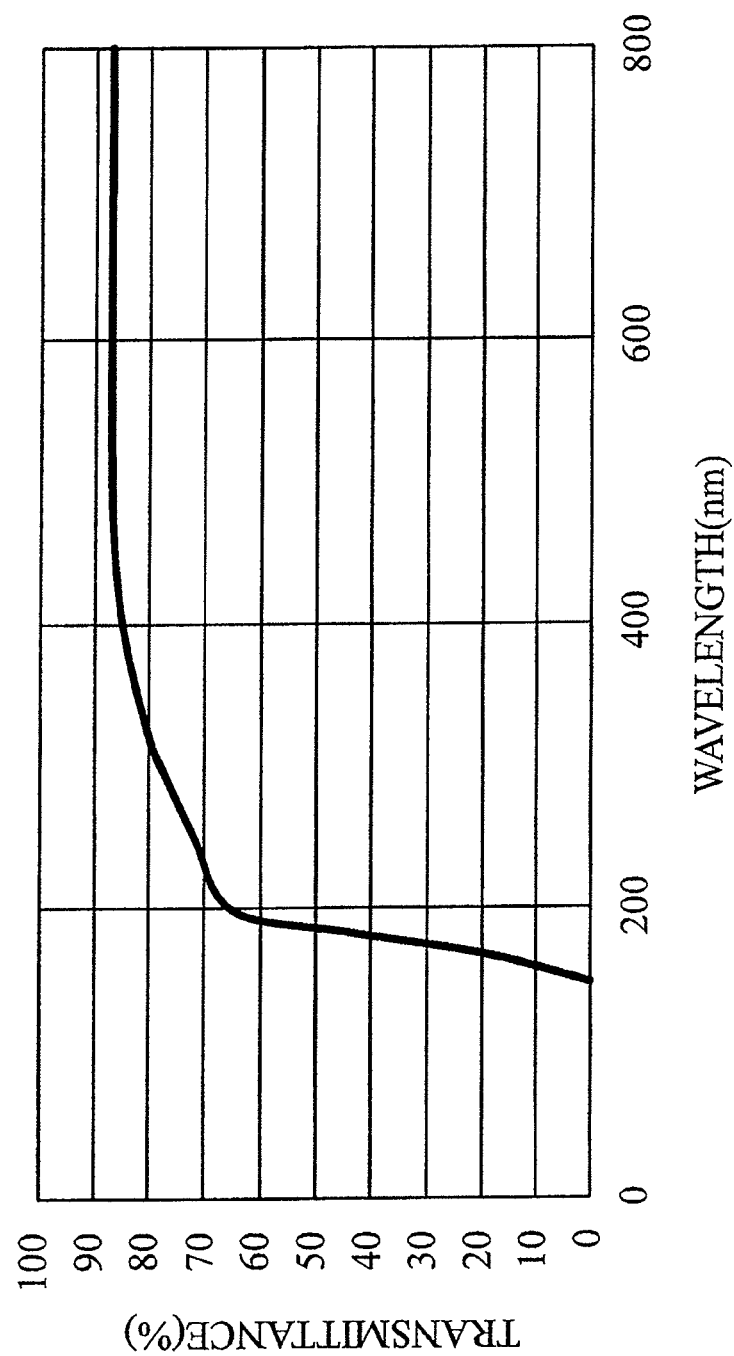
FIG. 7 is a graph of the wavelength dependence of light transmittance of sapphire glass 1 mm in thickness.

Borosilicate is utilized as the material of the translucent cover 7, but sapphire may also be the material. FIG. 7 is a graph of the wavelength dependence of light transmittance of sapphire glass 1 mm in thickness. As shown in FIG. 7, the light transmittance of sapphire glass decreases at approximately 200 nm. In other words, creating the translucent cover 7 from sapphire glass makes it possible to suppress absorption of ultraviolet light or deep ultraviolet light which has a wavelength longer than 200 nm from the light emitted by the LED element 1, and also makes it possible to increase the light-emitting efficiency of the semiconductor light-emitting device A. Though details are omitted, besides borosilicate and sapphire glass, quartz glass which has low ultraviolet light absorption can also be utilized.

Second Embodiment

Figure 8:
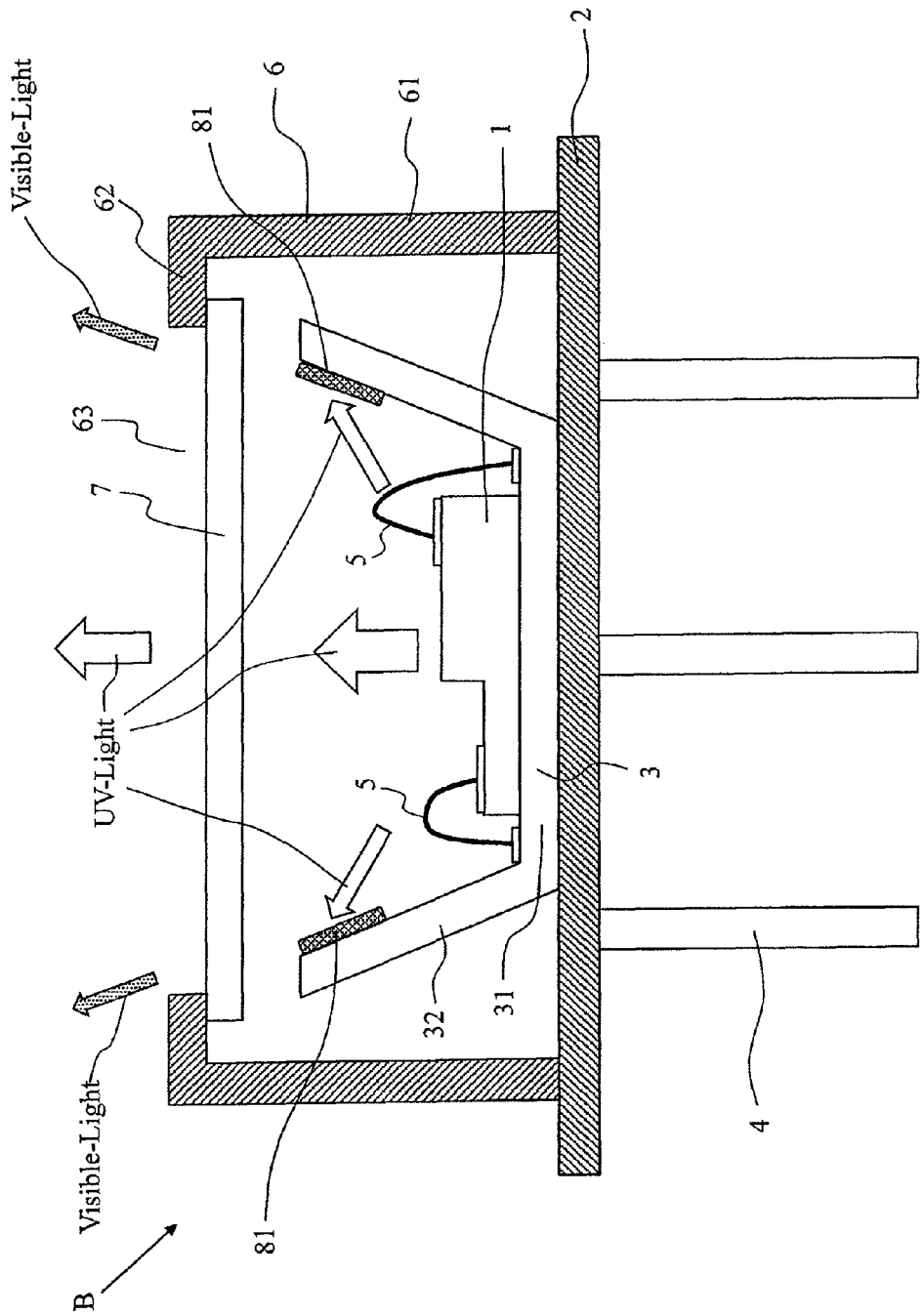
FIG. 8 is a drawing of another example of the semiconductor light-emitting device according to the present invention.

Another example of the semiconductor light-emitting device according to the present invention will be described referring to the drawings. FIG. 8 is a drawing of another example of a semiconductor light-emitting device according to the present invention. As shown in FIG. 8, in the semiconductor light-emitting device B, a UV-excited phosphor 81 is disposed on the side wall part 32 of the reflective cup 3 disposed inside the cap part 6, but the configuration is otherwise the same as the semiconductor light-emitting device A. Portions of the same substance are not described in detail. The nitride semiconductor light-emitting element 1 also uses the same configuration as that of the semiconductor light-emitting device A.

Even in a configuration comprising the UV-excited phosphor 81 on part of the side wall part 32 of the reflective cup 3, visible light is outputted by the UV-excited phosphor 81, and the light-emitting state of the semiconductor light-emitting device B can be confirmed by sight.

Compared to the semiconductor light-emitting device A, there is less distance between the nitride semiconductor light-emitting element 1 and the UV-excited phosphor 81. The shorter the light's wavelength, the greater the loss of light when propagating through air or the like. Because of this, compared to the semiconductor light-emitting device A, ultraviolet light radiated from the nitride semiconductor light-emitting element 1 can be converted to visible light more efficiently in the semiconductor light-emitting device B in which the distance between the nitride semiconductor light-emitting element 1 and the UV-excited phosphor 81 is small.

A possible method for creating the UV-excited phosphor 81 is electrophoresis using Al, for example. Al is used in the supporting substrate in the semiconductor light-emitting device B. This is because Al has high reflectivity even at short wavelengths. Due to having high reflectivity, Al makes it possible to suppress the generation of heat by the absorption of light transmitted through the phosphor, and deterioration of the phosphor's characteristics can therefore be suppressed. The use of a supporting substrate having high reflectivity is because light can be converted more effectively. Al is also preferred for its high capacity to radiate heat. Therefore, when a metal material other than Al is selected, a metal having high reflectivity is preferably used. A material having a high capacity to radiate heat is also preferred.

The reflective cup 3 itself may be formed from Al, and the UV-excited phosphor 8 may be formed using electrophoresis on the side wall part 32. In cases in which the reflective cup 3 is formed from a different material (including cases, for example, in which the cup is not electrically conductive or cannot be created by electrophoresis), the Al supporting substrate having the UV-excited phosphor 81 formed thereon may be attached to the side wall part 32. When an adhesive is used for this attachment, there is a risk of the adhesive deteriorating, but using a highly reflective metal (Al, for example) can reduce light absorption, suppress heat generation by the metal, and suppress deterioration of the phosphor and deterioration of the adhesive. Of course, a material that is resistant to ultraviolet light is more preferably selected as the material of the adhesive as well.

As described above, in cases in which the UV-excited phosphor 81 is formed directly on the reflective cup 3 or cases in which the UV-excited phosphor 81 is formed on the supporting substrate which is then attached to the reflective cup 3, a material that is highly reflective of ultraviolet light and that radiates heat satisfactorily is preferably used as the material from which the UV-excited phosphor 81 is formed. Al is preferably used as this material because it satisfies these conditions and is easily available. Other possible examples of the metal material other than Al include Ni, Pd, and the like which have comparatively high reflectivity in short wavelength regions.

Third Embodiment

Figure 9:
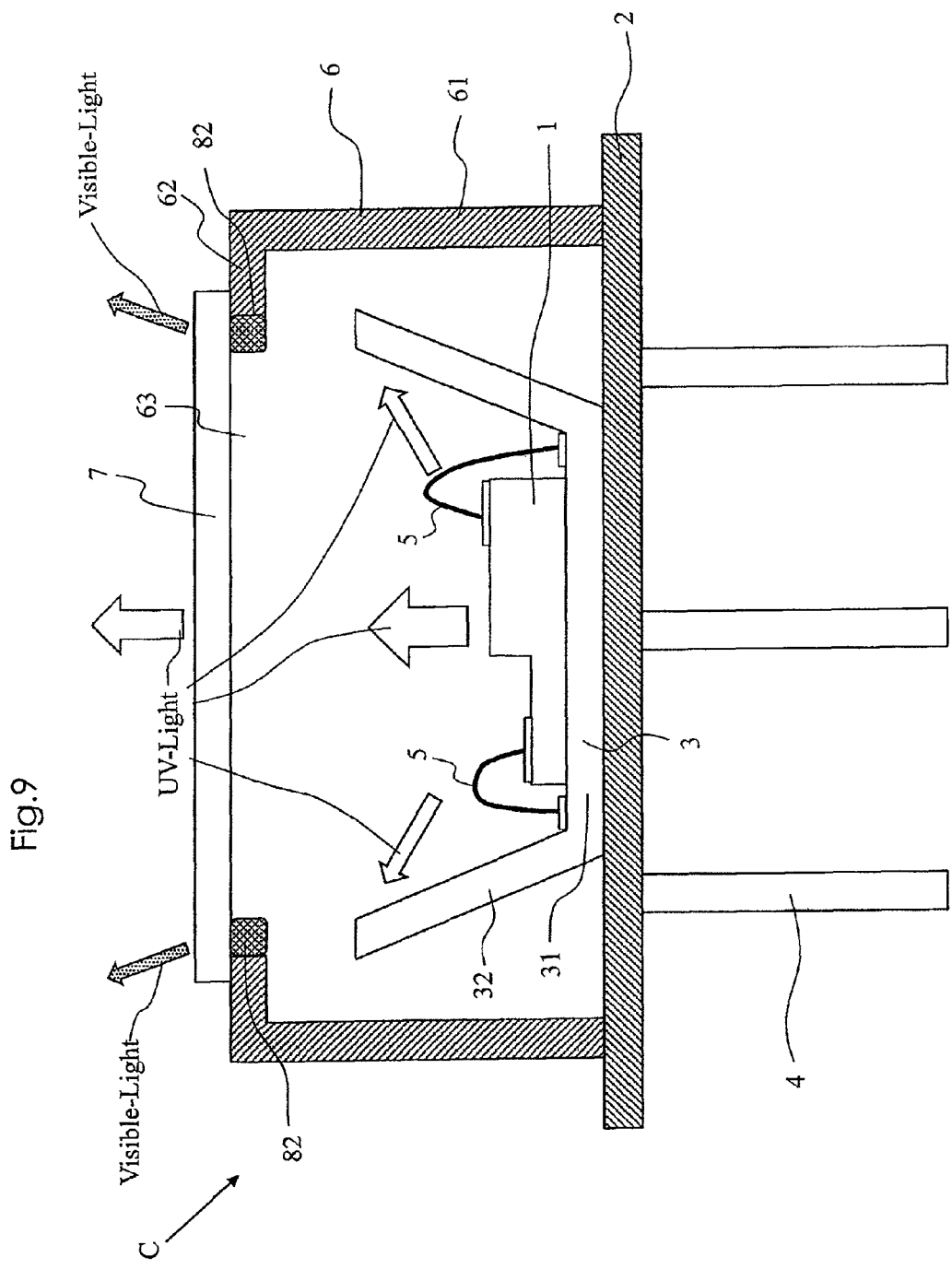
FIG. 9 is a drawing of yet another example of the semiconductor light-emitting device according to the present invention.

Yet another example of the semiconductor light-emitting device according to the present invention will be described with reference to the drawings. FIG. 9 is a drawing of yet another example of the semiconductor light-emitting device according to the present invention. Aside from the translucent cover 7 being disposed on the outside of the cap part 6, the semiconductor light-emitting device C shown in FIG. 9 has the same configuration as the semiconductor light-emitting device A shown in FIG. 1, and components that are essentially the same are not described in detail. A nitride semiconductor light-emitting element 1 having the same configuration as that of the semiconductor light-emitting device A is also used.

Due to the translucent cover 7 being disposed on the outside of the cap part 6, irradiation of the connecting part between the translucent cover 7 and the cap part 6 with ultraviolet light can be suppressed by the blocking of light from the LED element 1 by the cap part 6. In many cases, an adhesive is used to connect the translucent cover 7 and the cap part 6, and in such cases, deterioration of the adhesive by ultraviolet light can be suppressed. Irradiation of the bonded location by ultraviolet light can be suppressed also in cases of using a bonding method that does not use an adhesive, and deterioration by irradiation with ultraviolet light can therefore be suppressed. In the semiconductor light-emitting device C of this configuration, a UV-excited phosphor 82 is formed so as to be in proximity to the outer periphery of the through-hole 63 when the translucent cover 7 is attached to the cap part 6. Light passing through the outer periphery of the through-hole 63 can thereby be made visible.

Figure 10:
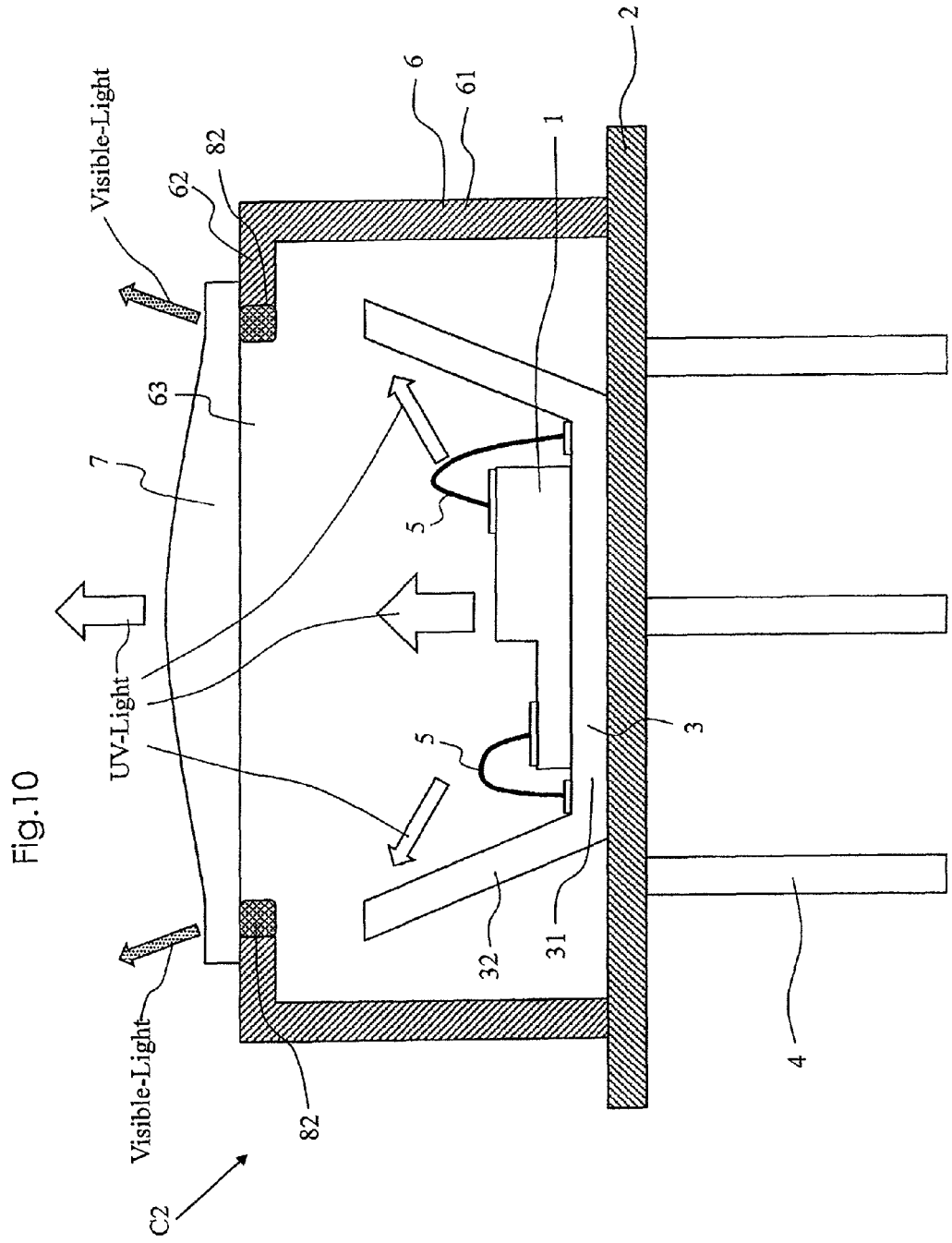
FIG. 10 is a drawing of yet another example of the semiconductor light-emitting device according to the present invention.
Figure 11:
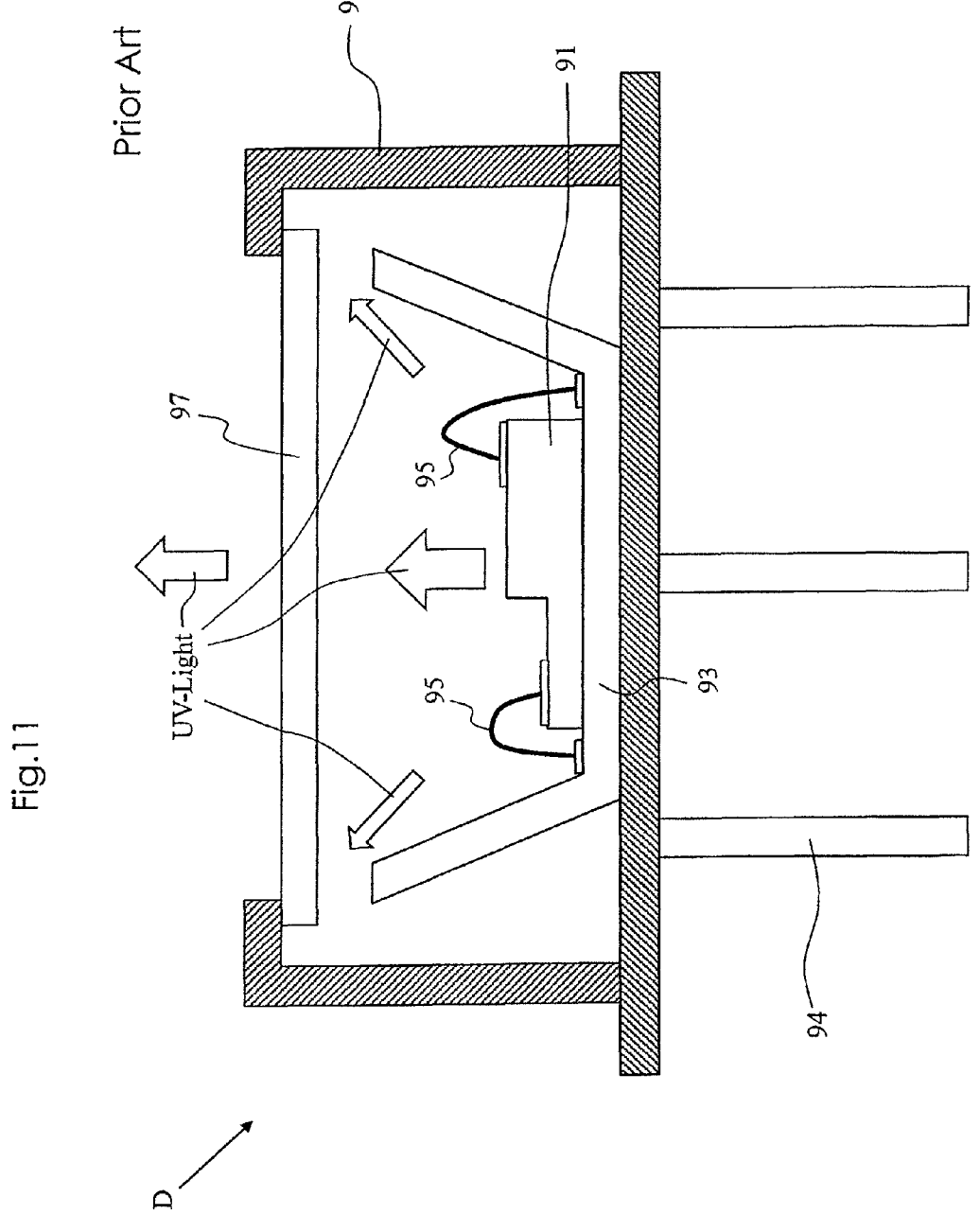
FIG. 11 is a drawing of a package of a conventional semiconductor light-emitting device.

FIG. 10 is a drawing of yet another example of a semiconductor light-emitting device according to the present invention. The semiconductor light-emitting device C2 has a configuration in which the translucent cover 7 is disposed on the outside of the cap part 6 as shown in FIG. 10, and one surface of the translucent cover 7 can therefore be formed into a convex lens shape for collecting light transmitted through, for example.

In the embodiments shown above, examples were described in which the nitride semiconductor light-emitting element had a horizontal structure, but those with a vertical structure, a flip-chip structure, and the like can also be used. A nitride semiconductor light-emitting element structure is not limited to a light-emitting diode, and could also mean a semiconductor laser or another semiconductor light-emitting element structure which emits ultraviolet light in the ultraviolet or deep ultraviolet region. The element structure, the electrode material, and other features are also one example and are not limited thereto. Cases are also shown in which the UV-excited phosphor 8 (81, 82) is formed on the translucent cover 7 or formed on the reflective cup 3, but the configuration may have the phosphor formed on both. In the case of a configuration in which the UV-excited phosphor 8 is formed non-continuously (see FIG. 5), light made visible (visible light) by the UV-excited phosphor 8 need not be light of the same wavelength, and light of different wavelengths may be outputted depending on the location.

The arrangement may also be set up so that light made visible by the UV-excited phosphor 8 is widely dispersed after passing through the through-hole 63 of the cap part 6. Due to this irradiation such that the visible light scatters in this manner, it is possible to confirm whether or not the semiconductor light-emitting device is activated and to reduce the risk of damage to the eyes or skin even when no light is observed near the optical axis where energy of the light outputted from the semiconductor light-emitting device is high.

Embodiments of the present invention are described above, but the present invention is not limited what is described therein. The embodiments of the present invention can be improved in various ways as long as there is no deviation from the scope of the invention.

The semiconductor light-emitting device according to the present invention can be employed in purification devices for disinfecting or sterilizing water or air, medical equipment for performing medical treatment by irradiation with ultraviolet light, and the like.

What is claimed is:

1. A semiconductor light-emitting device comprising:
   a semiconductor light-emitting element for emitting ultraviolet light having a wavelength in an ultraviolet or deep ultraviolet region;
   a cap part which shields the ultraviolet light, the cap part encircling the semiconductor light-emitting element;
   a through-hole which is formed in a top part of the cap part and through which the ultraviolet light passes;
   a translucent cover through which some or all of the ultraviolet light is transmitted, the translucent cover being disposed so as to hermetically close up the through-hole; and
   a UV-excited phosphor excited by part of the ultraviolet light and emitting visible light, the UV-excited phosphor being disposed inside the cap part,
   wherein the UV-excited phosphor is arranged such that the visible light passes mostly through a peripheral portion of the through-hole and the ultraviolet light passes mostly through an area of the through-hole surrounded by the peripheral portion.

2. The semiconductor light-emitting device of claim 1, the UV-excited phosphor being disposed on at least part of the translucent cover.

3. The semiconductor light-emitting device of claim 1, further comprising a reflective cup for reflecting ultraviolet light outputted by the semiconductor light-emitting element; the UV-excited phosphor being disposed on at least part of the reflective cup.

4. The semiconductor light-emitting device of claim 3, the reflective cup being configured from a material for reflecting ultraviolet light in the ultraviolet or deep ultraviolet region.

5. The semiconductor light-emitting device of claim 3, the UV-excited phosphor disposed on the reflective cup being in contact with a material for reflecting ultraviolet light in the ultraviolet or deep ultraviolet region.

6. The semiconductor light-emitting device of claim 5, aluminum being the material for reflecting ultraviolet light in the ultraviolet or deep ultraviolet region.

7. The semiconductor light-emitting device of claim 1, configured so that the space encircled by the cap part and the translucent cover is airtight, the space interior being sealed by a dried gas.

8. The semiconductor light-emitting device of claim 7, the dried gas sealed in the interior having a dew point of −10° C. or less.

9. The semiconductor light-emitting device of claim 7, the dried gas being dry air.

10. The semiconductor light-emitting device of claim 7, the dried gas being nitrogen.

* * * * *